United States Patent
Lee et al.

(10) Patent No.: US 9,385,100 B1
(45) Date of Patent: Jul. 5, 2016

(54) INTEGRATED CIRCUIT PACKAGING SYSTEM WITH SURFACE TREATMENT AND METHOD OF MANUFACTURE THEREOF

(71) Applicants: Hun Teak Lee, Seongnam-si (KR); YoungChul Kim, Youngin-si (KR); Hyunll Bae, Seoul (KR); HeeSoo Lee, Anyang-si (KR); HeeJo Chi, Yeoju-gun (KR)

(72) Inventors: Hun Teak Lee, Seongnam-si (KR); YoungChul Kim, Youngin-si (KR); Hyunll Bae, Seoul (KR); HeeSoo Lee, Anyang-si (KR); HeeJo Chi, Yeoju-gun (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/659,905

(22) Filed: Mar. 17, 2015

Related U.S. Application Data

(60) Provisional application No. 61/969,007, filed on Mar. 21, 2014.

(51) Int. Cl.
  *H01L 21/44* (2006.01)
  *H01L 23/00* (2006.01)
  *H01L 21/56* (2006.01)

(52) U.S. Cl.
  CPC .............. *H01L 24/17* (2013.01); *H01L 21/563* (2013.01); *H01L 24/81* (2013.01); *H01L 2224/16113* (2013.01); *H01L 2224/16227* (2013.01); *H01L 2224/81395* (2013.01); *H01L 2224/81447* (2013.01); *H01L 2924/01029* (2013.01); *H01L 2924/0541* (2013.01); *H01L 2924/14* (2013.01)

(58) Field of Classification Search
  CPC ........... H01L 2224/16113; H01L 2224/16227; H01L 21/563; H01L 24/17; H01L 24/81; H01L 2224/81395; H01L 2224/81447; H01L 2924/00
  USPC .................. 438/108, 612–617; 257/E23.021, 257/E23.069; 228/180.22
  See application file for complete search history.

(56) References Cited

U.S. PATENT DOCUMENTS

| | | | |
|---|---|---|---|
| 6,352,925 B1 | 3/2002 | Schrock | |
| 6,969,674 B2 | 11/2005 | Chang et al. | |
| 7,081,681 B2 * | 7/2006 | Suzuki | H01L 24/10 257/758 |
| 7,759,786 B2 | 7/2010 | Kurita et al. | |
| 8,178,156 B2 | 5/2012 | Wang | |
| 8,884,443 B2 | 11/2014 | Chen et al. | |
| 2015/0194405 A1* | 7/2015 | Liang | H01L 24/17 257/737 |

OTHER PUBLICATIONS

U.S. Appl. 14,642,130, filed Mar. 9, 2015, Chi et al.

* cited by examiner

*Primary Examiner* — Jasmine Clark
(74) *Attorney, Agent, or Firm* — Wong & Rees LLP

(57) ABSTRACT

An integrated circuit packaging system, and a method of manufacture thereof, includes: an embedded trace substrate having bonding sites and traces embedded in a base material, an insulation layer on the traces, the insulation layer having a top surface coplanar with the top surface of the base material; and an integrated circuit die connected to the bonding sites.

14 Claims, 6 Drawing Sheets

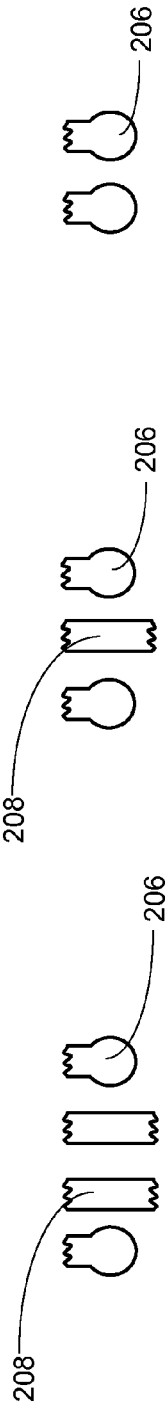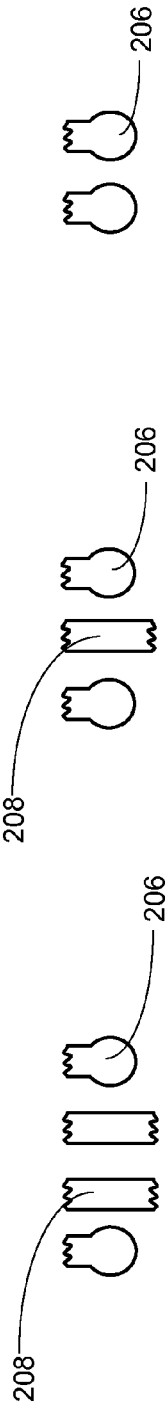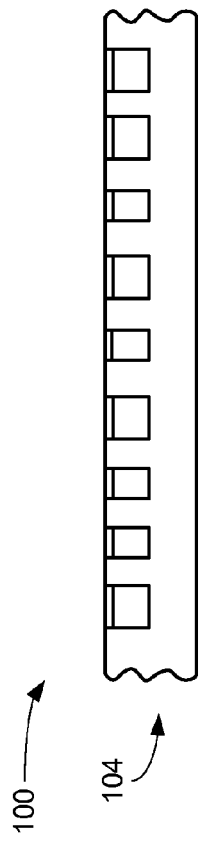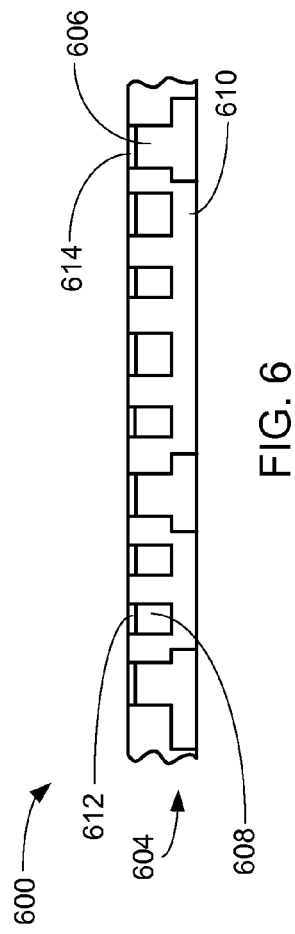

INTEGRATED CIRCUIT PACKAGING SYSTEM WITH SURFACE TREATMENT AND METHOD OF MANUFACTURE THEREOF

CROSS-REFERENCE TO RELATED APPLICATION(S)

This application claims the benefit of U.S. Provisional Patent Application Ser. No. 61/969,007 filed Mar. 21, 2014, and the subject matter thereof is incorporated herein by reference thereto.

TECHNICAL FIELD

The present invention relates generally to an integrated circuit packaging system, and more particularly to a system with embedded traces.

BACKGROUND ART

Electronic products have become an integral part of our daily lives. This has created a consistent and increasing expectation for new features, higher speed, more data, improved portability, etc. These demands have driven the development of electronic technology to reduce size, improve utility, and increase performance of the integrated circuit devices in an ever-increasing range of products such as smartphones, music players, televisions, and automobiles.

As components decrease in size, connection points must be closer together, and may become too crowded. As connection structures get closer and closer together, there is an increasing risk for cross-connections to cause problems like electrical shorts or unreliable connections.

Thus, a need still remains for a way of making connections more reliable. In view of the consumer demand for thinner and thinner devices yet with more functionality, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base embedded trace substrate having traces and bonding sites embedded in a base material; forming a mask over the bonding sites; forming an insulation layer on the traces, the insulation layer having a top surface coplanar with a top surface of the base material; removing the mask; and connecting an integrated circuit die to the bonding sites.

The present invention provides an integrated circuit packaging system including: an embedded trace substrate having bonding sites and traces embedded in a base material, an insulation layer on the traces, the insulation layer having a top surface coplanar with the top surface of the base material; and an integrated circuit die connected to the bonding sites.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 4A is a top view of one option for the arrangement of the bonding sites and the traces.

FIG. 4B is a top view of one option for the arrangement of the bonding sites and the traces.

FIG. 4C is a top view of one option for the arrangement of the bonding sites and the traces of FIG. 2.

FIG. 5 is a cross-sectional view of the integrated circuit packaging system with the integrated circuit die omitted for illustrative clarity.

FIG. 6 is a cross-sectional view of the integrated circuit packaging system with the integrated circuit die omitted for illustrative clarity and ease of comparison.

BEST MODE FOR CARRYING OUT THE INVENTION

Figure 1:
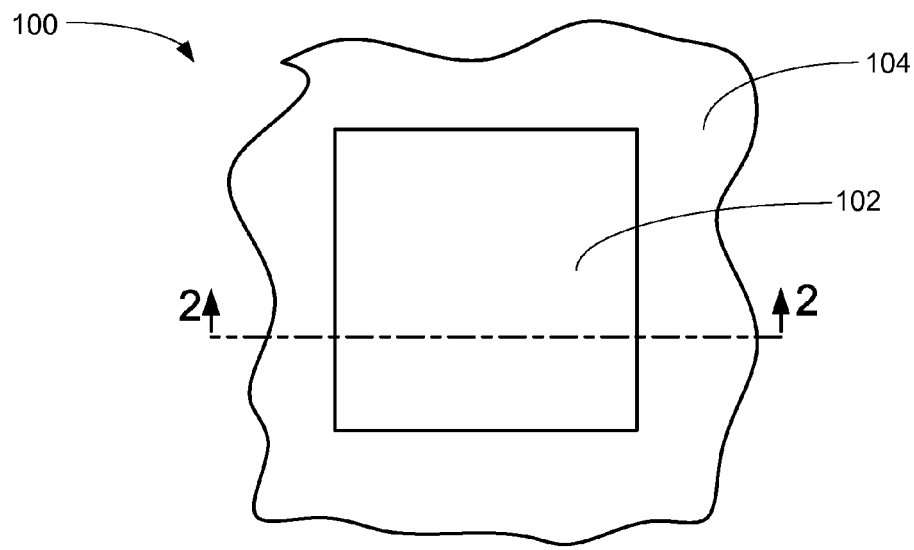
FIG. 1 is a top view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or contact surface of the contact pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure. Wavy lines are shown in the figures to indicate that only a partial view is shown.

Referring now to FIG. 1, therein is shown a top view of an integrated circuit packaging system 100 in a first embodiment of the present invention. Visible in this view is an integrated circuit die 102 and an embedded trace substrate 104. The integrated circuit die 102 is mounted on top of the embedded trace substrate 104 and connected to bonding sites on the embedded trace substrate 104. The embedded trace substrate 104 is defined as a substrate with traces and bonding sites embedded in the base material of the substrate and below the level of the top of the base material.

Figure 2:
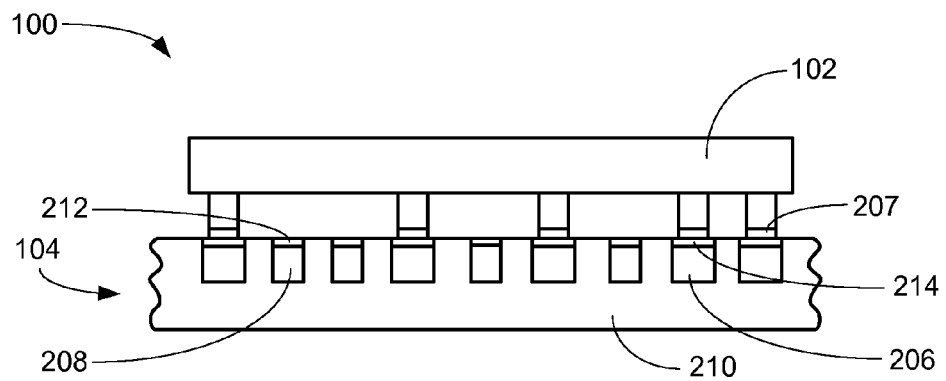
FIG. 2 is a cross-sectional view of the integrated circuit packaging system along section line 2-2 of FIG. 1.

Referring now to FIG. 2, therein is shown a cross-sectional view of the integrated circuit packaging system 100 along section line 2-2 of FIG. 1. The embedded trace substrate 104 can have bonding sites 206 and traces 208 embedded in a base material 210. The integrated circuit die 102 is attached to the bonding sites 206 through internal interconnects 207 such as solder balls, for example.

The traces 208 are defined as conductive structures for routing electrical signals between pads or connectors such as the bonding sites 206. The base material 210 can be an insulative layer such as a dielectric material. The bonding sites 206 can comprise bonding pads or bonding traces, for example. Both the traces 208 and the bonding sites 206 are embedded to be lower than the top surface of the base material 210 around the traces 208 and the bonding sites 206. The traces 208 and the bonding sites 206 can together form an interconnected structure which can also be called a circuit layer or a redistribution layer or an interconnect layer. This means that signal can be distributed from one of the bonding sites 206 through the traces 208 to different one of the bonding sites 206. The structure of the traces 208 can determine how signals are routed between the bonding sites 206. Although not visible in the figures, the traces 208 and the bonding sites 206 can be interconnected in all embodiments of the invention.

An insulation layer 212 can be formed on the traces 208, and the insulation layer 212 can be formed so the top surface of the insulation layer 212 is coplanar, lower, or higher than the top surface of the base material 210. In this example, the top surface of the insulation layer 212 is coplanar with the top surface of the base material 210. The insulation layer 212 can be a protective oxidation layer formed on the traces 208, for example. The insulation layer 212 can be formed from many materials. For example, the insulation layer 212 can be formed from copper black or brown oxide (black oxide is CuO or copper (II) oxide while brown oxide is $Cu_2O$ or copper (I) oxide), an organic insulation layer, or other dielectric material.

A protective layer 214 can be formed on the bonding sites 206 so the top surface of the protective layer 214 is coplanar, lower, or higher than the top surface of the base material 210. In this example, the top surface of the protective layer 214 is coplanar with the top surface of the base material 210. It is understood that if the protective layer 214 has a surface higher than the top surface of the base material 210, this can increase reliability due to a larger surface for solder attachment and because the underfill gap between the integrated circuit die 102 and the embedded trace substrate 104 will be larger, allowing easier underfill flow. The protective layer 214 can be formed from a material such as tin, nickel, gold, silver, organic solderability preservative (OSP), other anti-oxidation material, or a combination thereof, for example.

The insulation layer 212 can result from a surface treatment process which forms an oxidation layer on the traces 208 of the embedded trace substrate 104 (ETS). It has been discovered that the insulation layer 212 prevents solder bridging and reduces the cost compared to forming solder resist over the entire surface of the embedded trace substrate 104. Additionally, because the thickness of the insulation layer 212 is thin and coplanar with the top surface of the base material 210, a flat surface is provided which allows for unimpeded flow of underfill or molding compound under the integrated circuit die 102.

It has been discovered that the insulation layer 212 can help reduce bump pitch. The insulation layer 212 can replace solder resist and is non-wettable which can help prevent bump bridges. The prevention of bump bridges allows for a reduction in bump pitch without risking solder bridging and a short.

Figure 3:
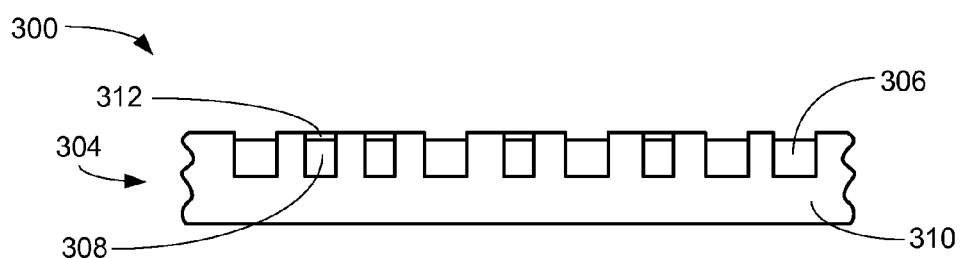
FIG. 3 is a cross-sectional view of the integrated circuit packaging system in a second embodiment of the present invention.

Referring now to FIG. 3, therein is shown a cross-sectional view of the integrated circuit packaging system 300 in a second embodiment of the present invention. The integrated circuit die 102 of FIG. 2 has been omitted for illustrative clarity. In this view, an embedded trace substrate 304 can be seen as similar to the embedded trace substrate 104 of FIG. 2. However, the embedded trace substrate 304 leaves bonding sites 306 exposed.

The embedded trace substrate 304 can have the bonding sites 306 and traces 308 embedded in a base material 310. The base material 310 can be an insulative layer such as a dielectric material. The bonding sites 306 can comprise bonding pads or bonding traces, for example. Both the traces 308 and the bonding sites 306 are embedded to be lower than the top surface of the base material 310 around the traces 308 and the bonding sites 306.

An insulation layer 312 can be formed on the traces 308, and the insulation layer 312 can be formed so the top surface of the insulation layer 312 is coplanar, lower, or higher than the top surface of the base material 310. In this example, the top surface of the insulation layer 312 is coplanar with the top surface of the base material 310. The insulation layer 312 can be a protective oxidation layer formed on the traces 308, for example. The insulation layer 312 can be formed from many materials. For example, the insulation layer 312 can be formed from copper black or brown oxide (black oxide is CuO or copper (II) oxide while brown oxide is $Cu_2O$ or copper (I) oxide), an organic insulation layer, or other dielectric material.

The insulation layer 312 can result from a surface treatment process which forms an oxidation layer on the traces 308 of the embedded trace substrate 304. It has been discovered that the insulation layer 312 prevents solder bridging and reduces the cost compared to forming solder resist over the entire surface of the embedded trace substrate 304. Additionally, because the thickness of the insulation layer 312 is thin and coplanar with the top surface of the base material 310, a flat surface is provided which allows for unimpeded flow of underfill or molding compound under the integrated circuit die 102.

It has been discovered that the insulation layer 312 can help reduce bump pitch. The insulation layer 312 can replace solder resist and is non-wettable due to the surface energy differences which can help prevent bump bridges between the bonding sites 306 and the traces 308. The prevention of bump bridges allows for a reduction in bump pitch without risking solder bridging and a short.

Referring now to FIG. 4A, therein is shown a top view of one option for the arrangement of the bonding sites 206 and the traces 208. In this example, there are two of the traces 208 between each of the bonding sites 206. The wavy lines indicate that only a partial view is shown. It is also understood that the bonding sites 206 are shown as bonding pads for example only and that the bonding sites 206 can also be bonding traces. Additionally for this example, and for the following examples, it is understood that these options can apply to all embodiments in that these are not the only options available for routing of the traces 208 and the bonding sites 206.

Referring now to FIG. 4B, therein is shown a top view of one option for the arrangement of the bonding sites 206 and the traces 208. In this example, there is one of the traces 208 between each of the bonding sites 206.

Referring now to FIG. 4C, therein is shown a top view of one option for the arrangement of the bonding sites 206 and the traces 208 of FIG. 2. In this example, there are none of the traces 208 between the bonding sites 206.

Referring now to FIG. 5, therein is shown a cross-sectional view of the integrated circuit packaging system 100 with the integrated circuit die 102 of FIG. 4 omitted for illustrative clarity. The embedded trace substrate 104 is shown here without the integrated circuit die 102 for clarity and consistency with how other embodiments will be presented.

Referring now to FIG. 6, therein is shown a cross-sectional view of the integrated circuit packaging system 600 with the integrated circuit die 102 omitted for illustrative clarity and ease of comparison. In this example, an embedded trace substrate 604 is shown with bottom contacts visible, though otherwise similar to the embedded trace substrate 304 of FIG. 3. The embedded trace substrate 604 can have bonding sites 606 and traces 608 embedded in a base material 610. The traces 608 are defined as conductive structures for routing electrical signals between pads or connectors. The base material 610 can be an insulative layer such as a dielectric material. The bonding sites 606 can comprise bonding pads or bonding traces, for example.

Both the traces 608 and the bonding sites 606 are embedded to be lower than the top surface of the base material 610 around the traces 608 and the bonding sites 606. The bonding sites 606 can be directly connected to the bottom contacts such that vias are unnecessary. The bottom contacts can be exposed through the bottom of the base material 610. The advantage of the via-less structure is that connections through the bottom contacts can be routed through the circuit layer of the traces 608 and the bonding sites 606 to one of the bonding sites 606 which is remote from the bottom contact in question. This allows for flexible routing capability between the top and the bottom of the embedded trace substrate 604.

An insulation layer 612 can be formed on the traces 608, and the insulation layer 612 can be formed so the top surface of the insulation layer 612 is coplanar, lower, or higher than the top surface of the base material 610. In this example, the top surface of the insulation layer 612 is coplanar with the top surface of the base material 610. The insulation layer 612 can be a protective oxidation layer formed on the traces 608, for example. The insulation layer 612 can be formed from many materials. For example, the insulation layer 612 can be formed from copper black or brown oxide (black oxide is CuO or copper (II) oxide while brown oxide is $Cu_2O$ or copper (I) oxide), an organic insulation layer, or other dielectric material.

A protective layer 614 can be formed on the bonding sites 606 so the top surface of the protective layer 614 is coplanar, lower, or higher than the top surface of the base material 610. In this example, the top surface of the protective layer 614 is coplanar with the top surface of the base material 610. It is understood that if the protective layer 614 has a surface higher than the top surface of the base material 610, this can increase reliability due to a larger surface for solder attachment and because the underfill gap between the integrated circuit die 102 and the embedded trace substrate 604 will be larger, allowing easier underfill flow. The protective layer 614 can be formed from a material such as tin, nickel, gold, silver, organic solderability preservative (OSP), other anti-oxidation material, or a combination thereof, for example.

The insulation layer 612 can result from a surface treatment process which forms an oxidation layer on the traces 608 of the embedded trace substrate 604. It has been discovered that the insulation layer 612 prevents solder bridging and reduces the cost compared to forming solder resist over the entire surface of the embedded trace substrate 604. Additionally, because the thickness of the insulation layer 612 is thin and coplanar with the top surface of the base material 610, a flat surface is provided which allows for unimpeded flow of underfill or molding compound under the integrated circuit die 602.

It has been discovered that the insulation layer 612 can help reduce bump pitch. The insulation layer 612 can replace solder resist and is non-wettable which can help prevent bump bridges. The prevention of bump bridges allows for a reduction in bump pitch without risking solder bridging and a short.

Figure 7:
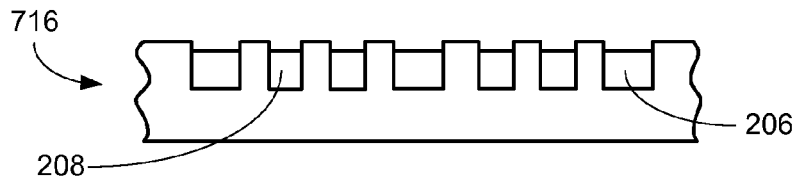
FIG. 7 is the integrated circuit packaging system in a base substrate formation phase of manufacture.

Referring now to FIG. 7, therein is shown the integrated circuit packaging system 100 in a base substrate formation phase of manufacture. This process flow can also apply to the integrated circuit packaging system 500 or 600 of FIG. 5 or FIG. 6. In this figure, a base embedded trace substrate 716 can be seen. The base embedded trace substrate 716 has been formed with the traces 208 and the bonding sites 206 already embedded in the base material 210. In these and all other figures the bonding sites 206 are shown as wider than the traces 208 for ease of identification only, and it is understood that this is done for illustration only.

Figure 8:
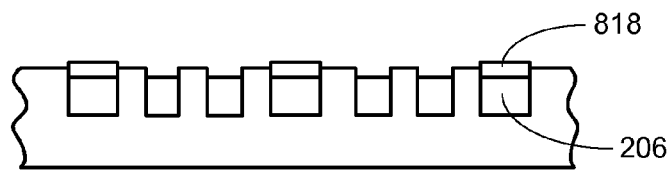
FIG. 8 is the structure of FIG. 7 in a masking phase of manufacture.

Referring now to FIG. 8, therein is shown the structure of FIG. 7 in a masking phase of manufacture. In this phase, a mask 818 is applied or deposited on the bonding sites 206. The traces 208 are left exposed.

Figure 9:
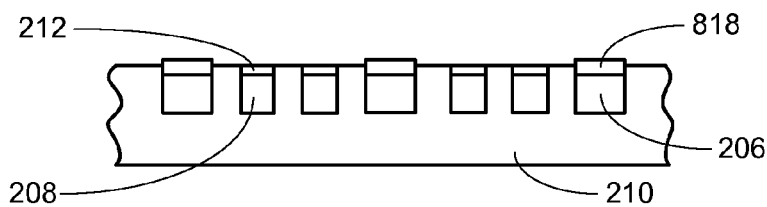
FIG. 9 is the structure of FIG. 8 in an insulation phase of manufacture.

Referring now to FIG. 9, therein is shown the structure of FIG. 8 in an insulation phase of manufacture. The insulation layer 212 is formed on the traces 208 through a process such as deposition, oxidation, printing, sputtering, or a combination thereof. In this example, a copper black or brown oxide can be formed on the traces 208 in order to form the insulation layer 212 through a process such as etching and roughening on a micro scale followed by an oxidation process. The insulation layer 212 has a top surface coplanar with the top surface of the base material 210.

In a further step (not shown), the mask 818 can be removed. This can complete the embedded trace substrate 104 of FIG. 3. A surface treatment can be applied to form the protective layer 214 of FIG. 2 on the bonding sites 206 a process such as electroplating, electroless plating, printing, sputtering, or a combination thereof, for example. The formation of the protective layer 214 can then complete the embedded trace substrate 104 of FIG. 2. The protective layer 214 can be formed on the bonding sites 206 before or after the removal of the mask 818.

Figure 10:
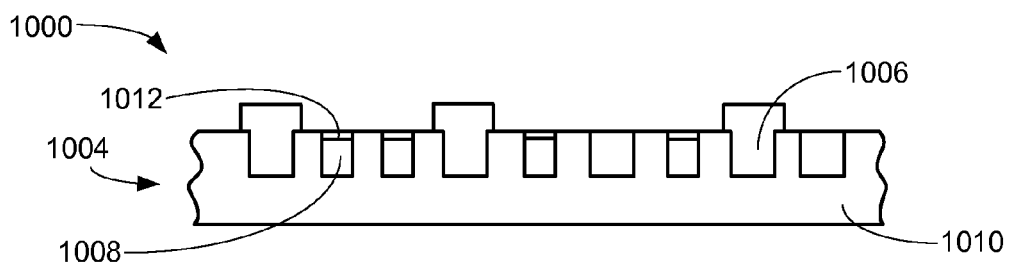
FIG. 10 is a cross-sectional view of the integrated circuit packaging system in a third embodiment of the present invention.

Referring now to FIG. 10, therein is shown a cross-sectional view of the integrated circuit packaging system 1000 in a third embodiment of the present invention. The integrated circuit die 102 has been omitted for illustrative clarity. In this view, an embedded trace substrate 1004 can be seen as similar to the embedded trace substrate 304 of FIG. 3. However, the embedded trace substrate 1004 leaves bonding sites 1006 exposed.

The embedded trace substrate 1004 can have the bonding sites 1006 and traces 1008 embedded in a base material 1010. The base material 1010 can be an insulative layer such as a dielectric material. The bonding sites 1006 can comprise bonding pads or bonding traces, for example. The traces 1008 are embedded to be lower than the top surface of the base material 1010 around the traces 1008. The bonding sites 1006 can extend above the top surface of the base material 1010. Some of the bonding sites 1006 can have a wider width once above the top surface of the base material 1010 such that overhang portion of the bonding sites 1006 is directly on the top surface of the base material 1010. Some of the bonding sites 1006 are not extended above the top surface of the base material 1010. This can create a vertically staggered formation of the bonding sites 1006 which can help reduce the incidence of bump bridging.

An insulation layer 1012 can be formed on the traces 1008, and the insulation layer 1012 can be formed so the top surface of the insulation layer 1012 is coplanar, lower, or higher than the top surface of the base material 1010. In this example, the top surface of the insulation layer 1012 is coplanar with the top surface of the base material 1010. The insulation layer 1012 can be a protective oxidation layer formed on the traces 1008, for example. The insulation layer 1012 can be formed from many materials. For example, the insulation layer 1012 can be formed from copper black or brown oxide (black oxide is CuO or copper (II) oxide while brown oxide is $Cu_2O$ or copper (I) oxide), an organic insulation layer, or other dielectric material.

The insulation layer 1012 can result from a surface treatment process which forms an oxidation layer on the traces 1008 of the embedded trace substrate 1004. It has been discovered that the insulation layer 1012 prevents solder bridging and reduces the cost compared to forming solder resist over the entire surface of the embedded trace substrate 1004. Additionally, because the thickness of the insulation layer 1012 is thin and coplanar with the top surface of the base material 1010, a flat surface is provided which allows for unimpeded flow of underfill or molding compound under the integrated circuit die 102.

It has been discovered that the insulation layer 1012 can help reduce bump pitch. The insulation layer 1012 can replace solder resist and is non-wettable which can help prevent bump bridges. The prevention of bump bridges allows for a reduction in bump pitch without risking solder bridging and a short.

Figure 11:
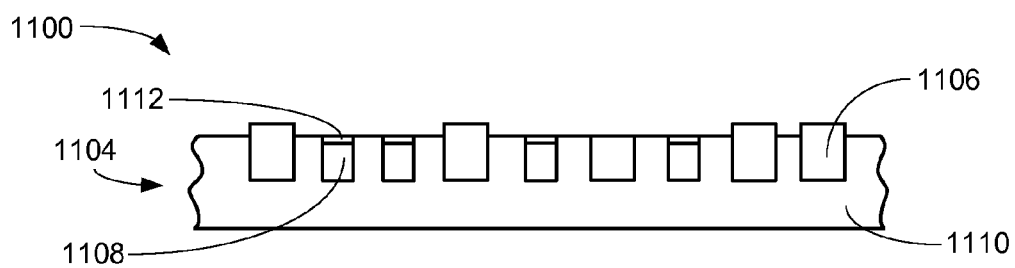
FIG. 11 is a cross-sectional view of the integrated circuit packaging system in a fourth embodiment of the present invention.

Referring now to FIG. 11, therein is shown a cross-sectional view of the integrated circuit packaging system 1100 in a fourth embodiment of the present invention. The integrated circuit die 102 has been omitted for illustrative clarity. In this view, an embedded trace substrate 1104 can be seen as similar to the embedded trace substrate 304 of FIG. 3. However, the embedded trace substrate 1104 leaves bonding sites 1106 exposed.

The embedded trace substrate 1104 can have the bonding sites 1106 and traces 1108 embedded in a base material 1110. The base material 1110 can be an insulative layer such as a dielectric material. The bonding sites 1106 can comprise bonding pads or bonding traces, for example. The traces 1108 are embedded to be lower than the top surface of the base material 1110 around the traces 1108. The bonding sites 1106 can extend above the top surface of the base material 1110. Because the bonding sites 1106 extend above the surface of the base material 1110, there is lower chance for bump bridging across the base material 1110.

An insulation layer 1112 can be formed on the traces 1108, and the insulation layer 1112 can be formed so the top surface of the insulation layer 1112 is coplanar, lower, or higher than the top surface of the base material 1110. In this example, the top surface of the insulation layer 1112 is coplanar with the top surface of the base material 1110. The insulation layer 1112 can be a protective oxidation layer formed on the traces 1108, for example. The insulation layer 1112 can be formed from many materials. For example, the insulation layer 1112 can be formed from copper black or brown oxide (black oxide is CuO or copper (II) oxide while brown oxide is $Cu_2O$ or copper (I) oxide), an organic insulation layer, or other dielectric material.

The insulation layer 1112 can result from a surface treatment process which forms an oxidation layer on the traces 1108 of the embedded trace substrate 1104. It has been discovered that the insulation layer 1112 prevents solder bridging and reduces the cost compared to forming solder resist over the entire surface of the embedded trace substrate 1104. Additionally, because the thickness of the insulation layer 1112 is thin and coplanar with the top surface of the base material 1110, a flat surface is provided which allows for unimpeded flow of underfill or molding compound under the integrated circuit die 102.

It has been discovered that the insulation layer 1112 can help reduce bump pitch. The insulation layer 1112 can replace solder resist and is non-wettable which can help prevent bump bridges. The prevention of bump bridges allows for a reduction in bump pitch without risking solder bridging and a short.

Figure 12:
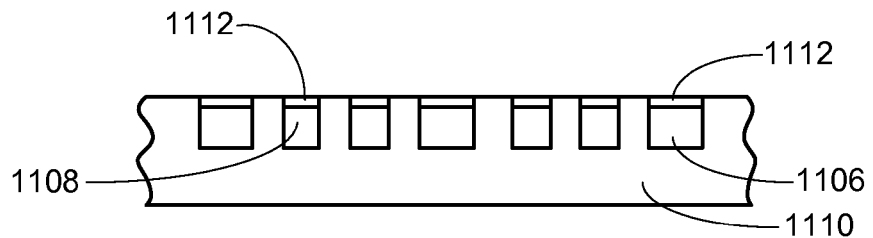
FIG. 12 is the integrated circuit packaging system in an insulation phase of manufacture.

Referring now to FIG. 12, therein is shown the integrated circuit packaging system 1100 in an insulation phase of manufacture. This process flow can also apply to the integrated circuit packaging system 1000. Starting from the same kind of base substrate as the base embedded trace substrate 716 of FIG. 7, the insulation layer 1112 is formed on the traces 1108 and the bonding sites 1106 through a process such as deposition, oxidation, printing, sputtering, or a combination thereof. In this example a copper black or brown oxide can be formed on the traces 1108 in order to form the insulation layer 1112. The insulation layer 1112 has a top surface coplanar with the top surface of the base material 1110.

Figure 13:
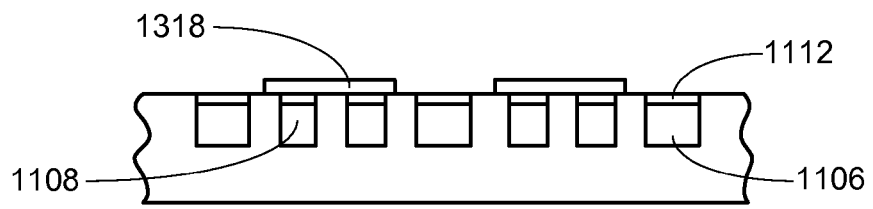
FIG. 13 is the structure of FIG. 12 in a masking phase of manufacture.

Referring now to FIG. 13, therein is shown the structure of FIG. 12 in a masking phase of manufacture. A mask 1318 is applied to cover the insulation layer 1112 which is on the traces 1108. The mask 1318 does not cover the bonding sites 1106.

Figure 14:
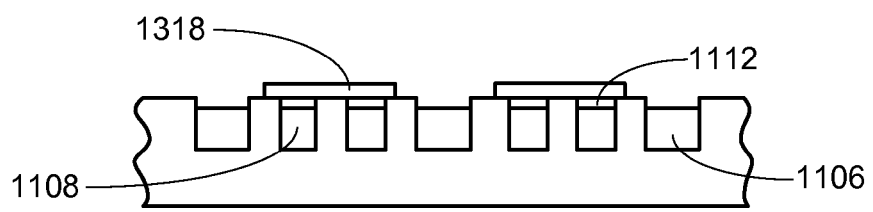
FIG. 14 is the structure of FIG. 13 in a removal phase of manufacture.

Referring now to FIG. 14, therein is shown the structure of FIG. 13 in a removal phase of manufacture. In this phase, the insulation layer 1112 is removed from the bonding sites 1106 through a process such as etching, for example. The mask 1318 can protect the insulation layer 1112 from the etching process.

Figure 15:
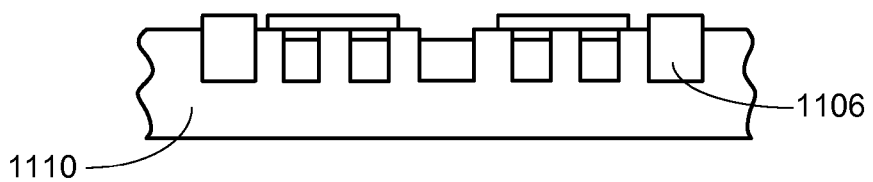
FIG. 15 is the structure of FIG. 14 in a plating phase of manufacture.

Referring now to FIG. 15, therein is shown the structure of FIG. 14 in a plating phase of manufacture. In this phase, some of the bonding sites 1106 are built up through a process such as electroplating or electroless plating such that the bonding sites 1106 extend above the top surface of the base material 1110.

Figure 16:
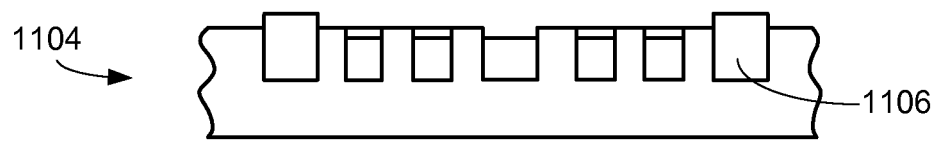
FIG. 16 is the structure of FIG. 15 in another removal phase of manufacture.

Referring now to FIG. 16, therein is shown the structure of FIG. 15 in another removal phase of manufacture. In this phase the mask 1318 of FIG. 13 can be removed. This can complete the embedded trace substrate 1104 of FIG. 11. Alternatively, for example, if the buildup of the extension of the bonding sites 1106 is allowed to expand past the vertical sides of the bonding sites 1006 within the base material 1010 of FIG. 10, such that the overhang portion is directly on the top surface of the base material 1010, then this can complete the embedded trace substrate 1004 of FIG. 10.

For illustrative purposes, the top of the bonding sites 1106 is shown as flat although it is understood that the top can also be convex or curved. The convex or curved shape for the bonding sites 1106 can allow for better contact with the solder ball, for example.

Figure 17:
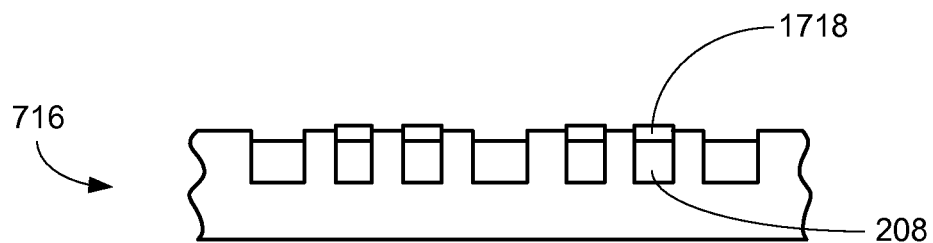
FIG. 17 is the integrated circuit packaging system in an alternate masking phase of manufacture.

Referring now to FIG. 17, therein is shown the integrated circuit packaging system 100 in an alternate masking phase of manufacture. This alternative process flow can also complete the integrated circuit packaging system 100 of FIG. 2. In this process flow, a mask 1718 is applied to the base embedded trace substrate 716 in order to cover the traces 208.

Figure 18:
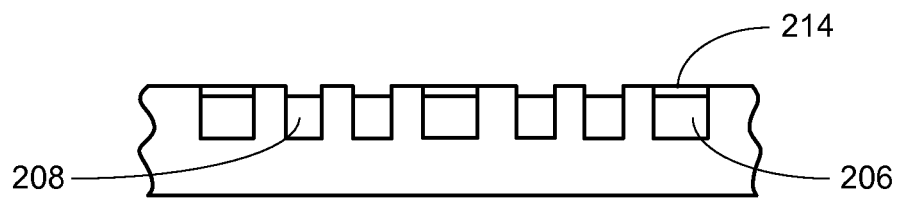
FIG. 18 is the structure of FIG. 17 in an alternate surface treatment phase of manufacture.

Referring now to FIG. 18, therein is shown the structure of FIG. 17 in an alternate surface treatment phase of manufacture. The protective layer 214 is applied to the bonding sites 206, which has been left uncovered and exposed by the mask 1718 of FIG. 17. The mask 1718 is then removed to leave the traces 208 uncovered. This is followed by the formation of the insulation layer 212 of FIG. 2 on the traces 208. The protective layer 214 formed on the bonding sites 206 prevents the insulation layer 212 from being formed on the bonding sites 206.

It has been discovered that applying the protective layer 214 before the application of the insulation layer 212 allows for quicker manufacturing and greater reliability. For example, because only one masking process is necessary, manufacturing is shorter with less possibility or risk for problems in the manufacturing process.

Figure 19:
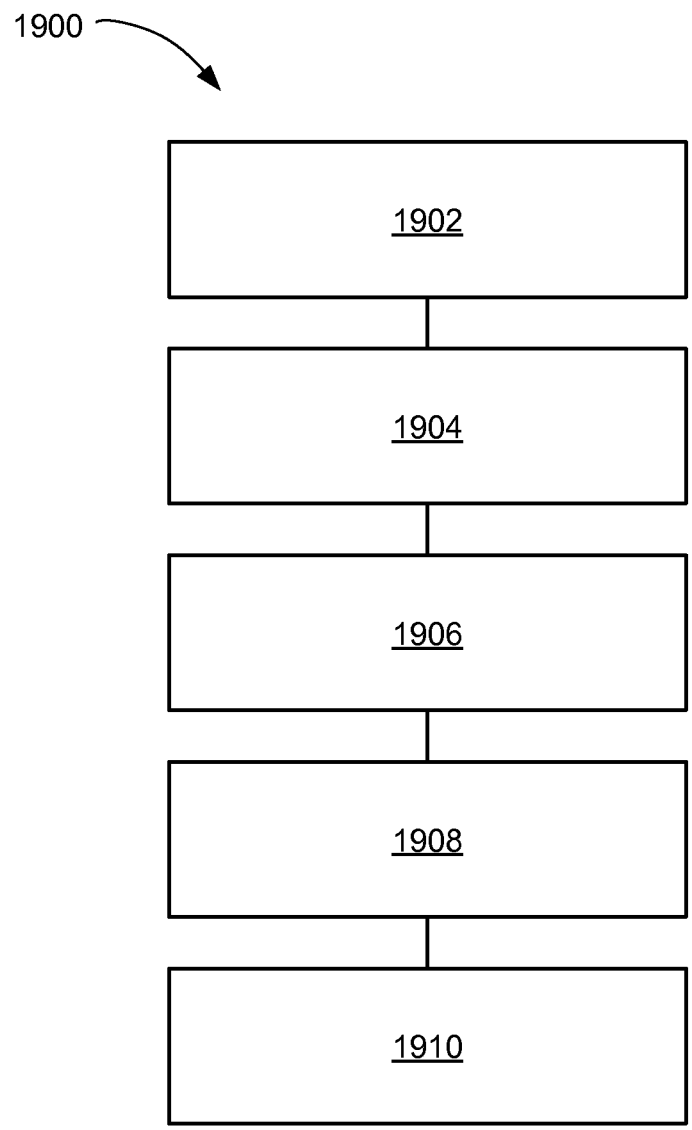
FIG. 19 is a flow chart of a method of manufacture of an integrated circuit packaging system in a further embodiment of the present invention.

Referring now to FIG. 19, therein is shown a flow chart of a method 1900 of manufacture of an integrated circuit packaging system in a further embodiment of the present invention. The method 1900 includes: providing a base embedded trace substrate having traces and bonding sites embedded in a base material in a block 1902; forming a mask over the bonding sites in a block 1904; forming an insulation layer on the traces, the insulation layer having a top surface coplanar with a top surface of the base material in a block 1906; removing the mask in a block 1908; and connecting an integrated circuit die to the bonding sites in a block 1910.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base embedded trace substrate having traces and bonding sites embedded in a base material, the bonding sites lower than a top surface of the base material;
   forming a mask over the bonding sites;
   forming an insulation layer on the traces, the insulation layer having a top surface coplanar with a top surface of the base material;
   removing the mask; and
   connecting an integrated circuit die to the bonding sites; and
   wherein:
   forming the insulation layer includes forming the insulation layer on the bonding sites.

2. The method as claimed in claim 1 further comprising forming a protective layer on the bonding sites, the protective layer having a top surface higher than the top surface of the base material.

3. The method as claimed in claim 1 wherein providing the base embedded trace substrate includes providing the base embedded trace substrate having two traces between each of the bonding sites.

4. The method as claimed in claim 1 wherein providing the base embedded trace substrate includes providing the base embedded trace substrate having one of the traces between each of the bonding sites.

5. The method as claimed in claim 1 wherein forming the insulation layer includes forming a copper black or brown oxide.

6. A method of manufacture of an integrated circuit packaging system comprising:
- providing a base embedded trace substrate having traces and bonding sites embedded in a base material, the bonding sites lower than a top surface of the base material;
- forming a mask over the traces;
- forming an insulation layer on the traces, the insulation layer having a top surface coplanar with a top surface of the base material; and
- connecting an integrated circuit die to the bonding sites; and wherein:
- forming the insulation layer includes forming the insulation layer on the bonding sites.

7. The method as claimed in claim 6 further comprising forming a protective layer on the bonding sites, the protective layer having a top surface higher than the top surface of the base material.

8. The method as claimed in claim 6 further comprising forming an overhang portion of some of the bonding sites in direct contact with the top surface of the base material.

9. The method as claimed in claim 6 further comprising extending the bonding sites above the top surface of the base material.

10. The method as claimed in claim 6 wherein forming the mask includes forming the mask over the traces and on the insulation layer.

11. The method as claimed in claim 6 wherein:
- forming the insulation layer on the traces includes forming the insulation layer on the bonding sites; and
- removing the insulation layer on the bonding sites after forming the mask over the traces.

12. The method as claimed in claim 6 further comprising plating additional conductive material on the bonding sites for extending the bonding sites above the top surface of the base material.

13. The method as claimed in claim 6 further comprising depositing an underfill between the integrated circuit die and the insulation layer.

14. The method as claimed in claim 6 wherein forming the insulation layer includes forming a copper black or brown oxide.

* * * * *